United States Patent
Chen

(10) Patent No.: US 7,361,937 B2
(45) Date of Patent: Apr. 22, 2008

(54) WHITE-LIGHT EMITTING DEVICE AND THE USE THEREOF

(75) Inventor: Cheng-Chuan Chen, Tainan Hsien (TW)

(73) Assignee: Genesis Photonics Inc., Tainan Hsien (TW)

( * ) Notice: Subject to any disclaimer, the term of this patent is extended or adjusted under 35 U.S.C. 154(b) by 183 days.

(21) Appl. No.: 11/153,414

(22) Filed: Jun. 16, 2005

(65) Prior Publication Data

US 2006/0146563 A1    Jul. 6, 2006

(30) Foreign Application Priority Data

Jan. 6, 2005 (TW) .................. 94100340
Mar. 1, 2005 (TW) .................. 94106030

(51) Int. Cl.
*H01L 29/20* (2006.01)
(52) U.S. Cl. .................. 257/88; 257/14; 257/103; 257/E23.044; 257/E23.066; 257/E25.032; 257/E33.066
(58) Field of Classification Search .................. 257/88, 257/90, 18, 22, 14–15, 103, 190
See application file for complete search history.

(56) References Cited

U.S. PATENT DOCUMENTS

| | | | | |
|---|---|---|---|---|
| 6,163,038 A | * | 12/2000 | Chen et al. | 257/103 |
| 2005/0092980 A1 | * | 5/2005 | Chen et al. | 257/14 |
| 2005/0194608 A1 | * | 9/2005 | Chen | 257/100 |
| 2005/0230693 A1 | * | 10/2005 | Chen | 257/89 |
| 2006/0131595 A1 | * | 6/2006 | Chen | 257/89 |
| 2006/0231845 A1 | * | 10/2006 | Chen | 257/79 |

FOREIGN PATENT DOCUMENTS

JP       9-232627       * 9/1997

* cited by examiner

*Primary Examiner*—A. Sefer
(74) *Attorney, Agent, or Firm*—Foley & Lardner LLP

(57) ABSTRACT

A white-light emitting device includes a first die and a second die. The first die has a first semiconductor light-emitting layer emitting a first primary color light. The second die has a second semiconductor light-emitting layer emitting a second primary color light, and a third semiconductor light-emitting layer mounted proximate to the second semiconductor light-emitting layer and emitting a third primary color light. The first primary color light is combined with the second and third primary color lights so as to produce white light.

6 Claims, 15 Drawing Sheets

WHITE-LIGHT EMITTING DEVICE AND THE USE THEREOF

CROSS-REFERENCE TO RELATED APPLICATION

This application claims priority of Taiwanese Application No. 094100340, filed on Jan. 6, 2005, and Taiwanese Application No. 094106030, filed on Mar. 1, 2005.

BACKGROUND OF THE INVENTION

1. Field of the Invention

The invention relates to a white-light emitting device, more particularly to a white-light emitting device applicable to a backlight module.

2. Description of the Related Art

There are usually two types of backlight modules suitable for use in a liquid crystal display, i.e., a direct type backlight module and a side-edge type backlight module. Conventionally, a cold cathode fluorescent lamp is used as a light source for either type of the backlight modules. However, the cold cathode fluorescent lamp has disadvantages, such as use of poisonous mercury, fragility, inferior CRI (color rendering index), etc.

A backlight module that uses a light emitting diode (LED) as the light source was developed to overcome the aforesaid disadvantages. As shown in FIGS. 1 and 2, a direct type backlight module 1 is mounted directly on a rear side 22 of a liquid crystal module 2. The liquid crystal module 2 has the rear side 22 and a front side 21 opposite to the rear side 22, and includes a color filter unit 23, a liquid crystal unit 24, and a glass substrate unit 25 along a direction from the front side 21 to the rear side 22. The backlight module 1 includes a housing 11, which defines a receiving space 12 and which has a bottom wall 111, a printed circuit board 14 disposed on the bottom wall 111 of the housing 11, and a plurality of light emitting units 13 disposed on and connected electrically to the printed circuit board 14.

Each of the light emitting units 13 includes a first LED 131 emitting green light, a second LED 132 emitting blue light, a third LED 133 emitting red light, and a fourth LED 134 emitting green light. The lights emitted from the first, second, third, and fourth LEDs 131, 132, 133, 134 are combined with each other in the receiving space 12 so as to produce white light that is emitted to the rear side 22 of the liquid crystal module 2.

Since four LEDs are required for each of the light emitting units 13 in the aforesaid prior art, the housing 11 requires a relatively large receiving space 12 for a given number of the light emitting units 13. Furthermore, a relative long distance from the bottom wall 111 to a top edge 112 of the housing 11 is required for combining the lights emitted from the LEDs 131, 132, 133, 134 to obtain white light. Therefore, the housing 11 of the prior art cannot be reduced in thickness advantageously.

SUMMARY OF THE INVENTION

Therefore, it is an object of the present invention to provide a white-light emitting device which has a superior CRI, and which is applicable to a backlight module so as to reduce the thickness of the backlight module.

In the first aspect of this invention, a white-light emitting device includes a first die and a second die. The first die has a first semiconductor light-emitting layer emitting a first primary color light. The second die has a second semiconductor light-emitting layer emitting a second primary color light, and a third semiconductor light-emitting layer mounted proximate to the second semiconductor light-emitting layer and emitting a third primary color light. The first primary color light is combined with the second and third primary color lights so as to produce white light.

In the second aspect of this invention, a white-light emitting device includes a first package member and a second package member. The first package member has a first die emitting a first primary color light and a first carrying pad carrying the first die. The second package member has a second die emitting a second primary color light and a third primary color light, and a second carrying pad carrying the second die. The second and third primary color lights are combined with the first primary color light of the first die so as to produce white light.

In the third aspect of this invention, a backlight module includes the white-light emitting device of this invention.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
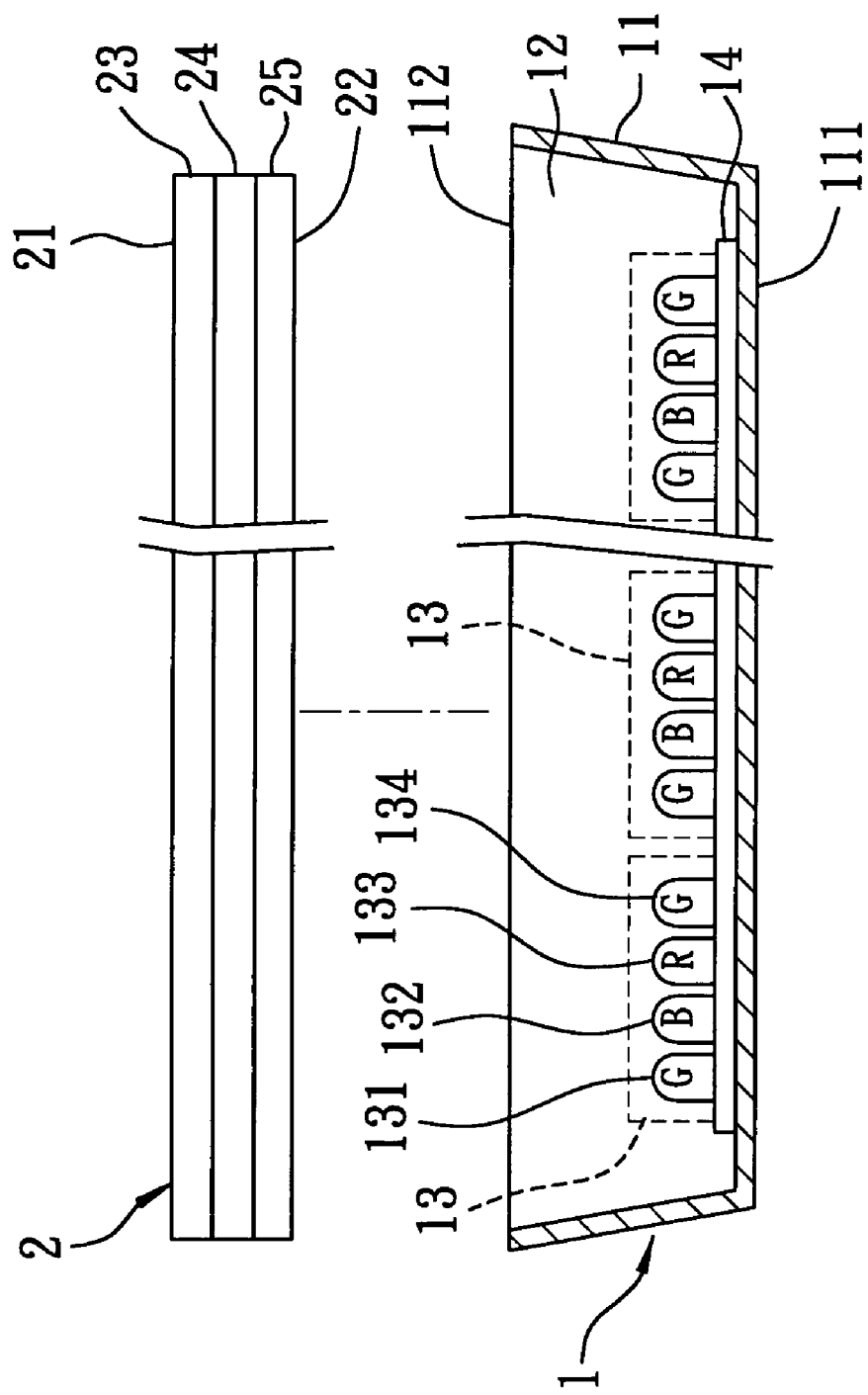
FIG. 1 is a fragmentary schematic sectional view of a conventional backlight module.
Figure 2:
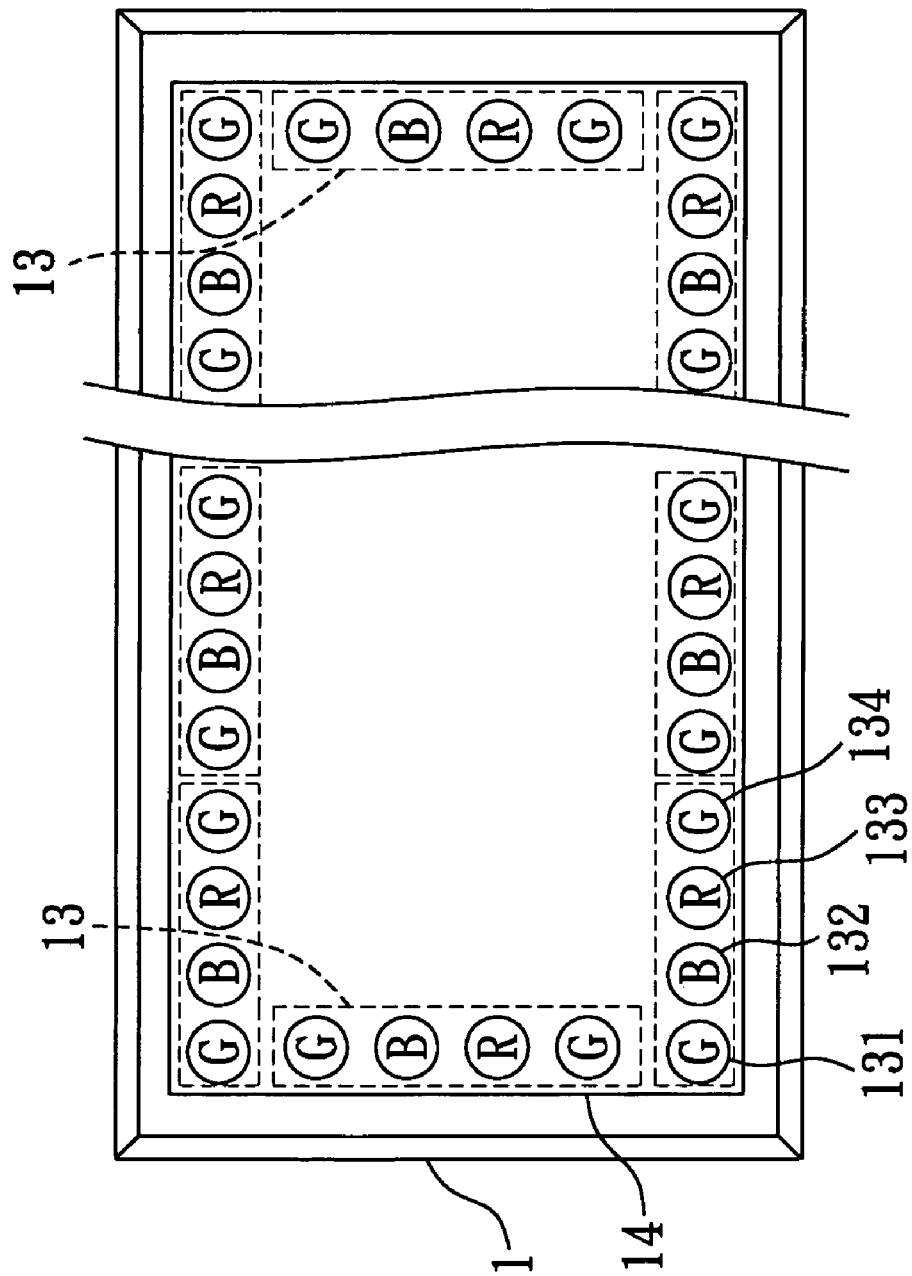
FIG. 2 is a fragmentary schematic top view of the conventional backlight module.

Before the present invention is described in greater detail, it should be noted that like elements are denoted by the same reference numerals throughout the disclosure.

Figure 3:
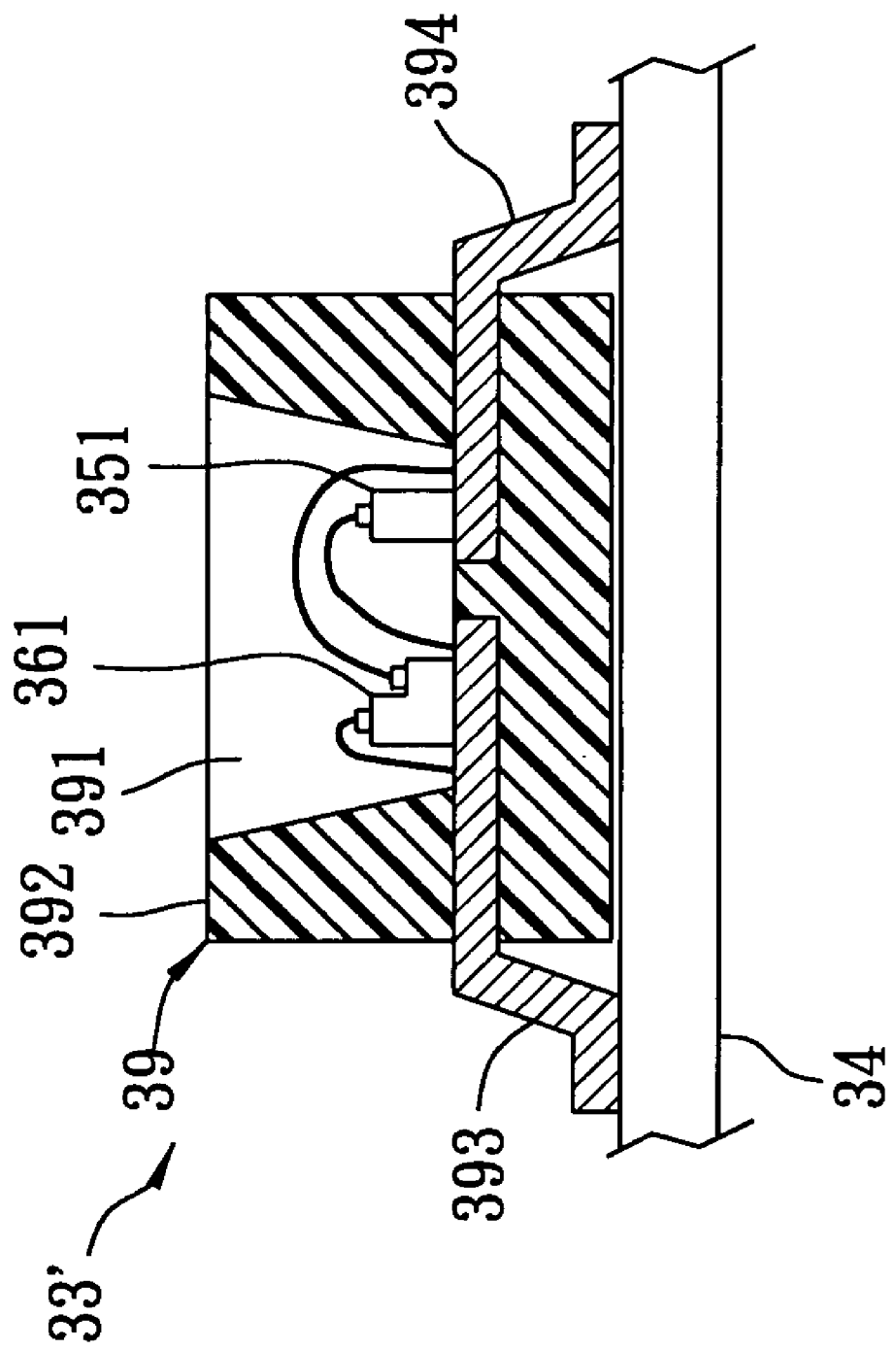
FIG. 3 is a fragmentary sectional view of the first preferred embodiment of a white-light emitting device according to this invention.
Figure 4:
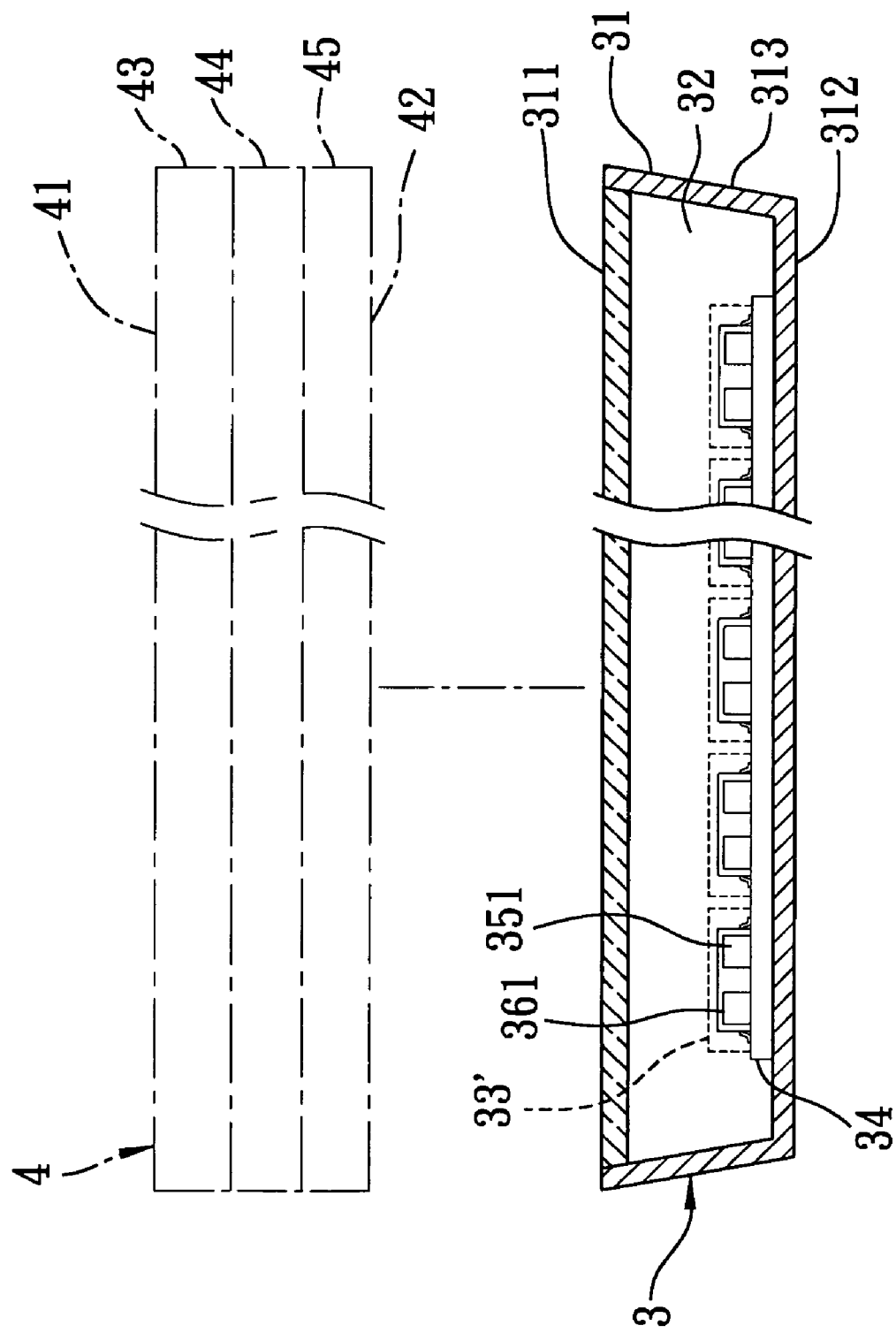
FIG. 4 is a fragmentary schematic sectional view of a direct type backlight module incorporating the first preferred embodiment of this invention.
Figure 5:
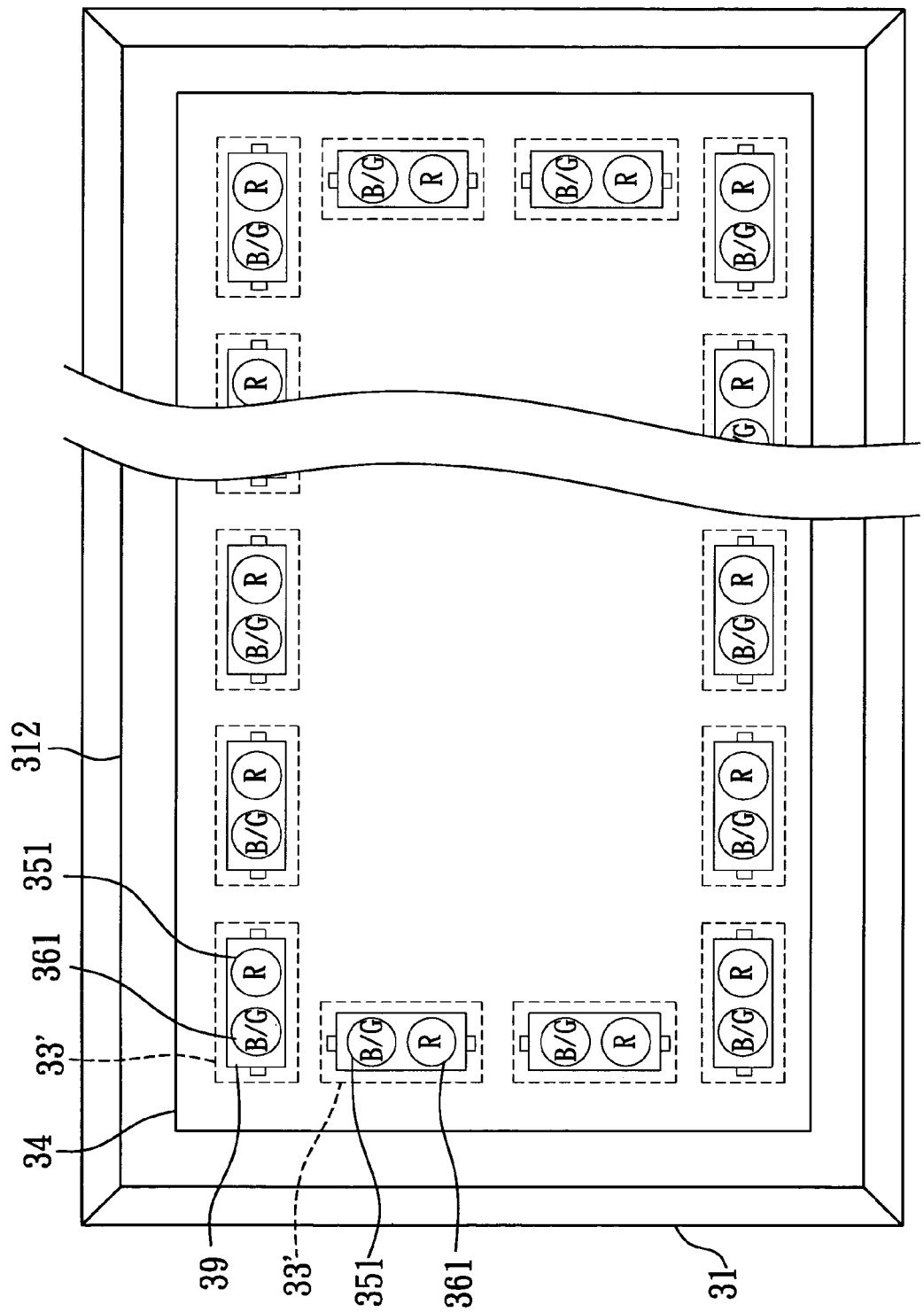
FIG. 5 is a fragmentary schematic top view of the backlight module of FIG. 4.

Referring to FIGS. 3, 4 and 5, the first preferred embodiment of a white-light emitting device 33' according to this invention is shown to be installed in a direct type backlight module 3. The backlight module 3 is mounted below a liquid crystal module 4. The liquid crystal module 4 has a front side 41 and a rear side 42, and includes a color filter unit 43, a liquid crystal unit 44, and a glass substrate unit 45 along a direction from the front side 41 to the rear side 42. The backlight module 3 includes a housing 31 defining a receiving space 32, and a plurality of the white-light emitting device 33' mounted in the receiving space 32. The housing 31 is configured as a wedge shape, and has a top wall 311 proximate to the rear side 42 of the liquid crystal module 4, a bottom wall 312 opposite to the top wall 311, and a peripheral wall 313 extending between the top and bottom walls 311,312 so as to define the receiving space 32. The top wall 311 of the housing 31 is light-transmissible.

Specifically referring to FIG. 3, the first preferred embodiment of the white-light device 33' of this invention is shown to include a first die 351, a second die 361, a package assembly 39 for packaging the first and second dies 351,361, and a conductive supporting unit 34.

The package assembly 39 includes a carrying pad 392 carrying the first and second dies 351,361 thereon, a first lead frame 394 (i.e., an n-type electrode lead frame) electrically connected to the first and second dies 351,361, and a second lead frame 393 (an p-type electrode lead frame) electrically connected to the first and second dies 351,361. The conductive supporting unit 34 is mounted below the carrying pad 392, and is electrically connected to the first and second lead frames 394,393 so as to supply electrical power to the first and second dies 351,352 via the first and second lead frames 394,393. In the preferred embodiment, the carrying pad 392 includes a receiving recess 391 for receiving the first and second dies 351,361. Optionally, a light-transmissive encapsulating material (not shown) can be filled in the receiving recess 391 to encapsulate the first and second dies 351,361. The first die 351 includes a first semiconductor light-emitting layer (not shown) emitting a first primary color light. In the preferred embodiment, the first primary color light is red light having a wavelength ranging from 575 nm to 700 nm.

Figure 6:
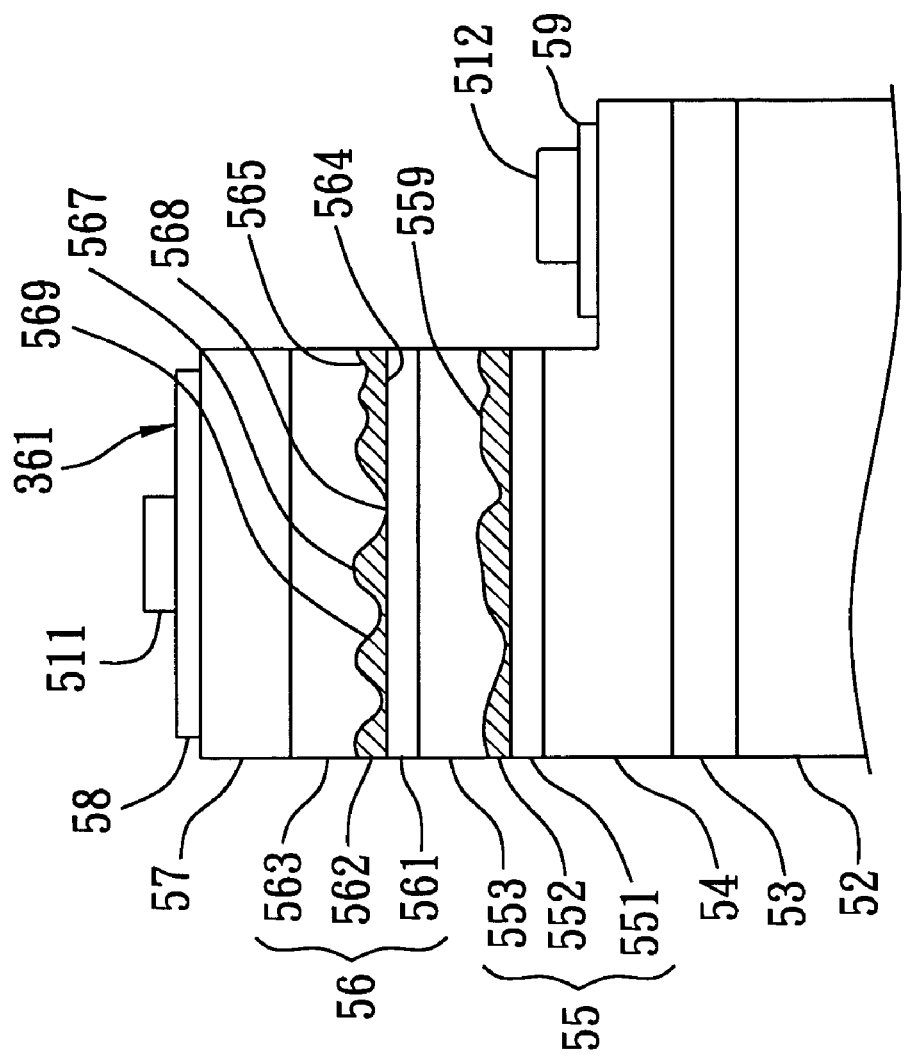
FIG. 6 is a fragmentary schematic view of a die used in the first preferred embodiment.

Referring to FIG. 6, the second die 361 includes a second semiconductor light-emitting layer 56 emitting a second primary color light, and a third semiconductor light-emitting layer 55 mounted proximate to the second semiconductor light-emitting layer 56 and emitting a third primary color light. The first primary color light is combined with the second and third primary color lights so as to produce white light. In addition to the second and third semiconductor light-emitting layers 56,55, the second die 361 includes a substrate 52, a buffering layer 53 mounted on the substrate 52, an n-type cladding layer 54 mounted on the buffering layer 53 and interposed between the buffering layer 53 and the third semiconductor light-emitting layer 55, a p-type cladding layer 57 mounted on the second semiconductor light-emitting layer 55, a p-side contacting layer 58 on the p-type cladding layer 57, a p-type electrode 511 mounted on the p-side contacting layer 58, an n-side contacting layer 59 mounted on the n-type cladding layer 54, and an n-type electrode 512 mounted on the n-side contacting layer 59.

The second semiconductor light-emitting layer 56 includes a first barrier film 563 proximate to the p-type cladding layer 57, a second barrier film 561 proximate to the third semiconductor light-emitting layer 55, and a carrier confining film 562 between the first and second barrier films 563,561. The carrier confining film 562 has a bottom surface 564 proximate to the second barrier film 561 and a top surface 565 proximate to the first barrier film 563, and is configured with a mountain shape profile 569 having a plurality of alternating peaks 567 and valleys 568.

Figure 7:
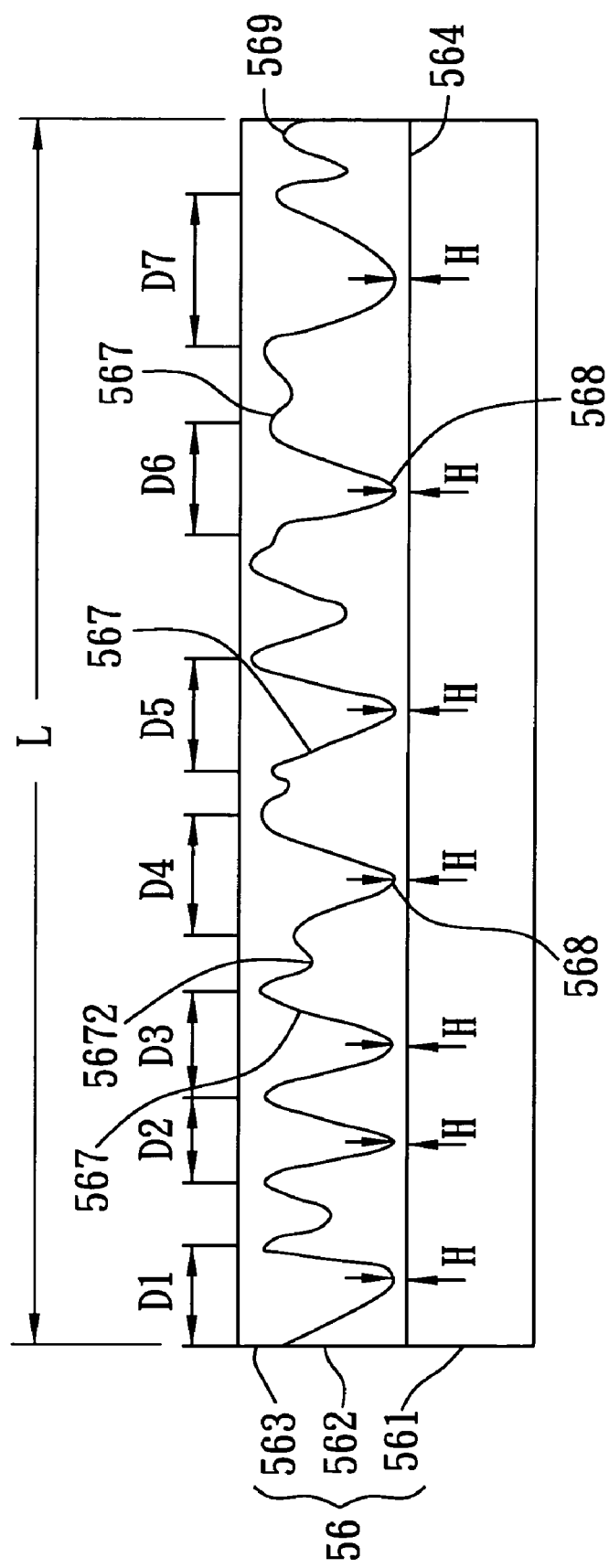
FIG. 7 is a schematic view of a semiconductor light-emitting layer used in the die of FIG. 6.

Referring to FIG. 7, in the mountain shape profile 569, each of the valleys 568 has a height (H) relative to the bottom surface 564 of the carrier confining film 562, and the height (H) ranges from 0 to 2 mm. Therefore, the recess portion 5672 does not meet the definition of the valley 568. A valley density is defined by a ratio of a summation of the widths (D1, D2, D3, D4, D5, D6, D7 . . . ) of the valleys 568 to a total length (L) of the second semiconductor light-emitting layer 56 along a direction that the widths (D1, D2, D3, D4, D5, D6, D7 . . . ) are measured. Preferably, the second semiconductor light-emitting layer 56 has a valley density ranging from 5% to 75%.

The carrier confining film 562 has an energy gap which should be smaller than those of the first and second barrier films 563,561. In the preferred embodiment, the carrier confining film 562 is made of an indium-containing material having the formula $Al_{(1-x-y)}In_yGa_xN$, wherein $0 \leq x < 1$, $0 < y \leq 1$, and $0 \leq 1-x-y < 1$. The first and second barrier films 563,561 are made of gallium nitride. The second primary color light emitted by the second semiconductor light-emitting layer 56 can be adjusted by varying the ratio of x and y so as to result in blue light having a wavelength ranging from 430 nm to 485 nm. The intensity of the second primary color light can be adjusted by varying the valley density of the mountain shape profile 569. In the preferred embodiment, the valley density of the second semiconductor light-emitting layer 56 is 38%.

Similarly, referring again to FIG. 6, the third semiconductor light-emitting layer 55 includes a first barrier film 553 proximate to the second barrier film 561 of the second semiconductor light-emitting layer 56, a second barrier film 551 proximate to the n-type cladding layer 54, and a carrier confining film 552 between the first and second barrier films 553,551. In the preferred embodiment, the materials for the first barrier film 553, the second barrier film 551 and the carrier confining film 552 of the third semiconductor light-emitting layer 55 are identical to those for the first barrier film 563, the second barrier film 561 and the carrier confining film 562 of the second semiconductor light-emitting layer 56. The third primary color light emitted by the third semiconductor light-emitting layer 55 can be adjusted by varying the ratio of x and y so as to result in green light having a wavelength ranging from 510 nm to 560 nm. The intensity of the third primary color light can be adjusted by varying the valley density of the mountain shape profile 559 of the carrier confining film 552. In the preferred embodiment, the valley density of the third semiconductor light-emitting layer 55 is 8%.

In addition to the fact that the intensities of the second and third primary color lights emitted respectively by the second and third semiconductor light-emitting layers 56,55 can be adjusted through the valley densities of the mountain shape profiles 569,559 of the second and third semiconductor light-emitting layers 56,55, the intensities of the second and third primary color lights can be further adjusted and increased by using a plurality of the second and third semiconductor light-emitting layers 56,55, respectively. Furthermore, the mountain shape profile 559 of the third semiconductor light-emitting layer 55 can be replaced with a quantum well.

Figure 8:
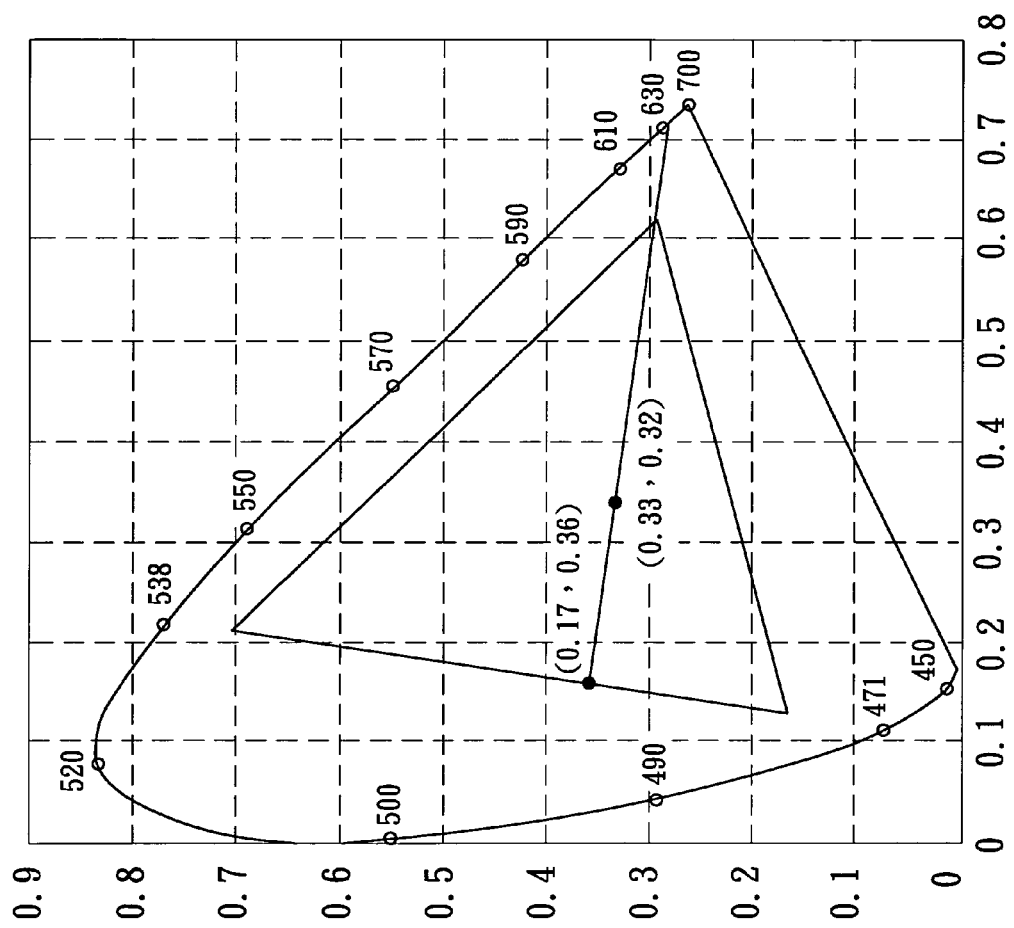
FIG. 8 is a chromaticity diagram of the first preferred embodiment.

Referring to FIG. 8, in the first die 351 of the white-light device 33' of the first preferred embodiment, the first primary color light is red light having a wavelength of 635 nm. The second and third semiconductor light-emitting layers 56,55 of the second die 361 can be adjusted in the aforesaid manner to emit the second primary color light, which is blue light having a wavelength of 471 nm, and the third primary color light, which is green light having a wavelength of 538 nm, respectively. The blue and green lights emitted by the second die 361 can be combined with the red light of the first die 351 so as to produce white light.

Figure 9:
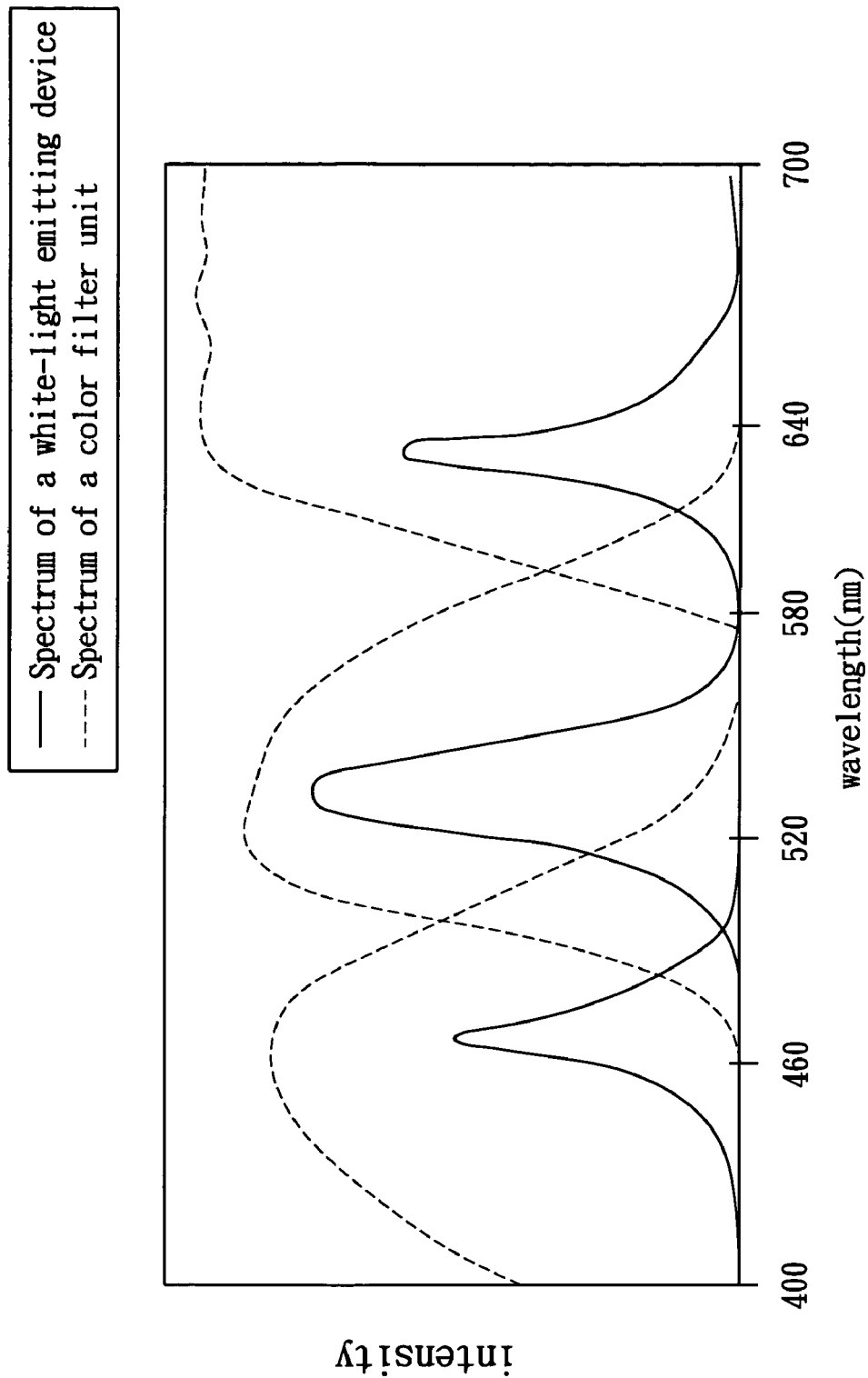
FIG. 9 illustrates spectrum characteristics of the first preferred embodiment.

Referring to FIG. 9, as indicated by the solid curve line, the relatively high intensities of the spectrum of the white-light emitting device 33' is located around 471 nm, 538 nm, and 635 nm, which correspond to the wavelength ranges of blue, green and red lights, respectively. As shown by the broken lines, which is a spectrum of the color filter unit 43, the wavelength ranges of the lights transmissible through the color filter unit 43 correspond to the relatively high intensities of the spectrum of the white-light emitting device 33'. Therefore, color rendering index, light transmittance, brightness, light saturation, and other optical characteristics of the backlight module can be improved by this invention.

Figure 10:
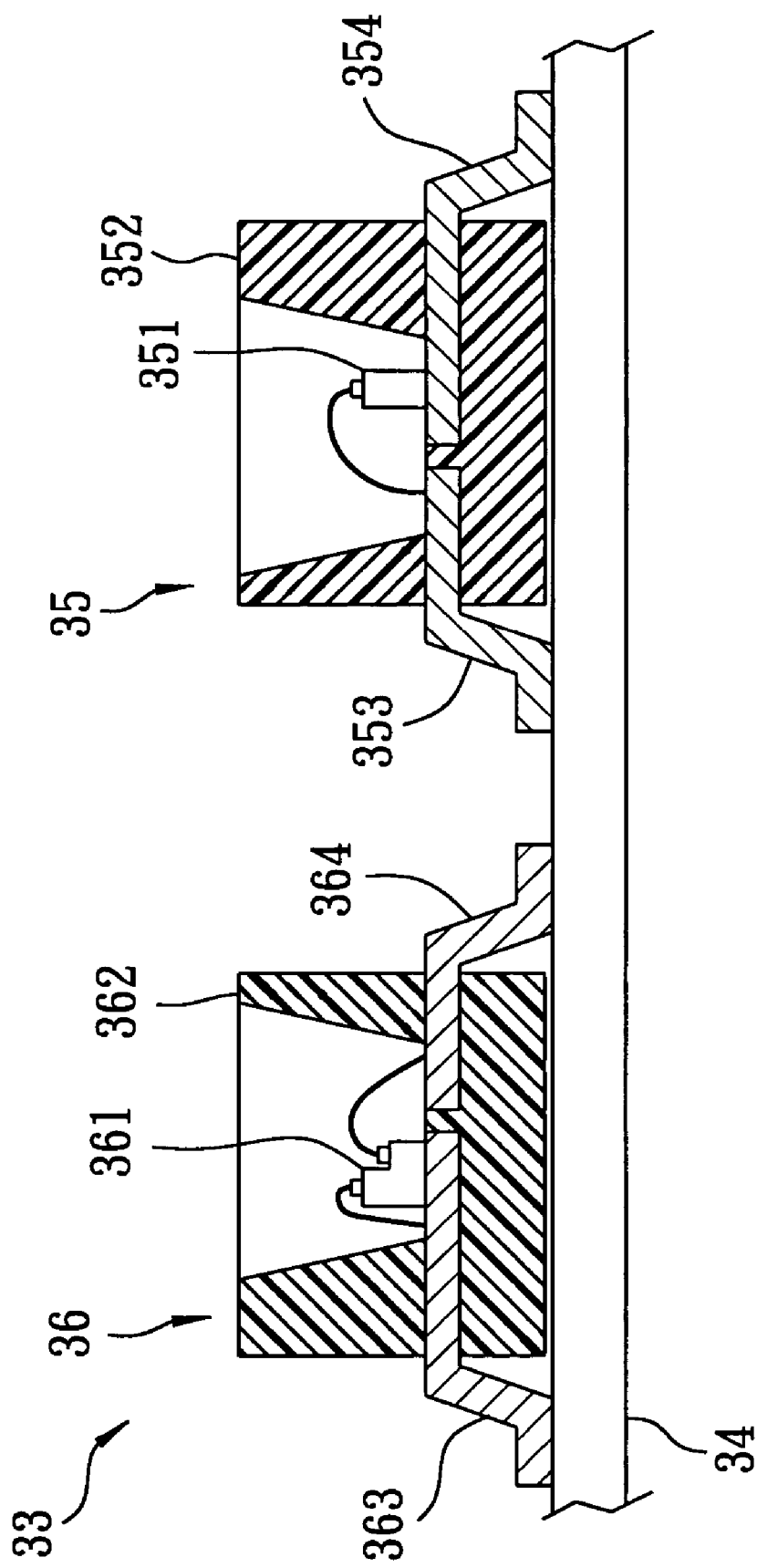
FIG. 10 is a fragmentary sectional view of the second preferred embodiment of a white-light emitting device according to this invention.
Figure 11:
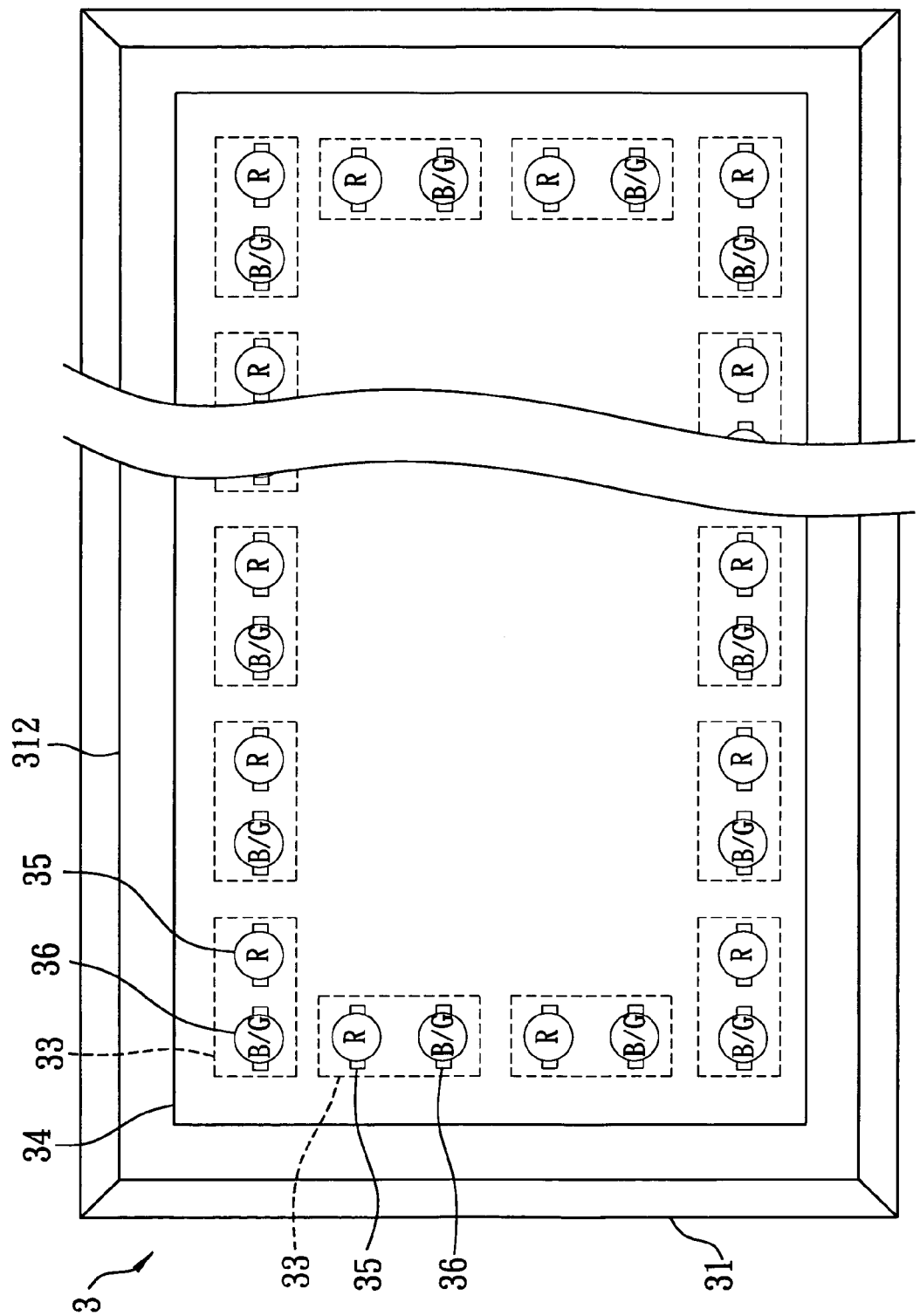
FIG. 11 is a fragmentary schematic top view of a direct type backlight module incorporating the second preferred embodiment of this invention.

Referring to FIGS. 10 and 11, the second preferred embodiment of a white-light emitting device 33 according to this invention is shown to be installed in the housing 31 of the direct type backlight module 3 identical to that shown in FIGS. 4 and 5. The white-light emitting device 33 includes a first package member 35, a second package member 36, and a conductive supporting unit 34 mounted on the bottom wall 312 of the housing 31 and supporting the first and second package members 35,36 thereon.

The first package member 35 includes a first die 351 emitting a first primary color light, a first carrying pad 352 carrying the first die 351, a first lead frame 354 penetrating though the first carrying pad 352 and electrically connected to the first die 351 and the conductive supporting unit 34, and a second lead frame 353 penetrating though the first carrying pad 352 and electrically connected to the first die 351 and the conductive supporting unit 34. In this preferred embodiment, the first die 351 is a light emitting diode. The first primary color light emitted by the first die is red light having a wavelength ranging from 575 nm to 700 nm.

The second package member 36 includes a second die 361 emitting a second primary color light and a third primary color light, a second carrying pad 362 carrying the second die 361, a first lead frame 364 penetrating though the second carrying pad 362 and electrically connected to the second die 361 and the conductive supporting unit 34, and a second lead frame 363 penetrating though the second carrying pad 362 and electrically connected to the second die 361 and the conductive supporting unit 34. The second die 361 in this preferred embodiment is identical to that in the first preferred embodiment. The second primary color light, which is blue light having a wavelength ranging from 430 nm to 485 nm, and the third primary color light, which is green light having a wavelength ranging from 510 nm to 560 nm, are combined with the first primary color light of the first die 351 so as to produce white light.

The conductive supporting unit 34 is used to supply electrical power to the first and second package members 35,36. In the preferred embodiment, the conductive supporting unit 34 is a printed circuit board. However, other structures, such as an electrically conductive wiring, can be used as the conductive supporting unit 34. Furthermore, the number of the conductive supporting unit 34 can be varied according to specific requirements in an actual application.

When the first and second package members 35,36 are actuated by electrical power, the first primary color light emitted from the first die 351 of the first package member 35 is combined with the second and third primary color lights emitted from the second die 361 of the second package member 36 in the receiving space 32 of the housing 31 to produce white light that is transmitted to the liquid crystal module 4.

Since the second die 361 can emit the second and third primary color lights simultaneously, the number of the light emitting diodes for each of the white-light emitting devices 33 can be reduced. The thickness of the backlight module 3 required for combining the first, second and third primary color lights to produce white light can be reduced. Therefore, the backlight module 3 can be minimized in thickness. Furthermore, for the first die 351 emitting the first primary color light of a given wavelength, the second die 361 can be adjusted in the valley density of the mountain shape profile, the ratio of x to y in the formula $Al_{(1-x-y)}In_yGa_xN$ of the indium-containing material for the carrier confining film 562, and the number of the second and third semiconductor light-emitting layers 56,55 to emit the second and third primary color lights having specific requirements in intensity and ratio so as to combine with the first primary color light to produce white light for the liquid crystal module 4. Therefore, in practice, the second die 361 having the specific requirements for the first die 351 emitting the first primary color light of a given wavelength can be designed easily to obtain the white-light emitting device 33.

Figure 12:
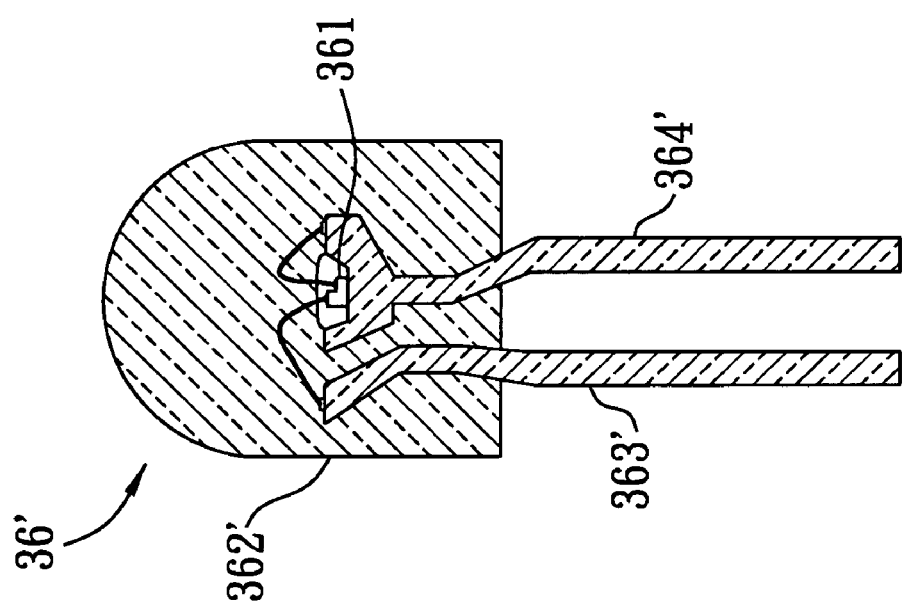
FIG. 12 is a sectional view of the third preferred embodiment of a white-light emitting device according to this invention.

Referring to FIG. 12, which illustrates the third preferred embodiment of this invention, the second package member 36 in the second preferred embodiment can be replaced by the package member 36' in this preferred embodiment. The package member 36' includes a die 361 emitting the second and third primary color lights, a carrying pad 362' carrying the die 361, and first and second lead frames 364',363' electrically connected to the die 361, respectively. The carrying pad 362' is made of a light-transmissive encapsulating material (such as, resin) encapsulating the die 361.

Figure 13:
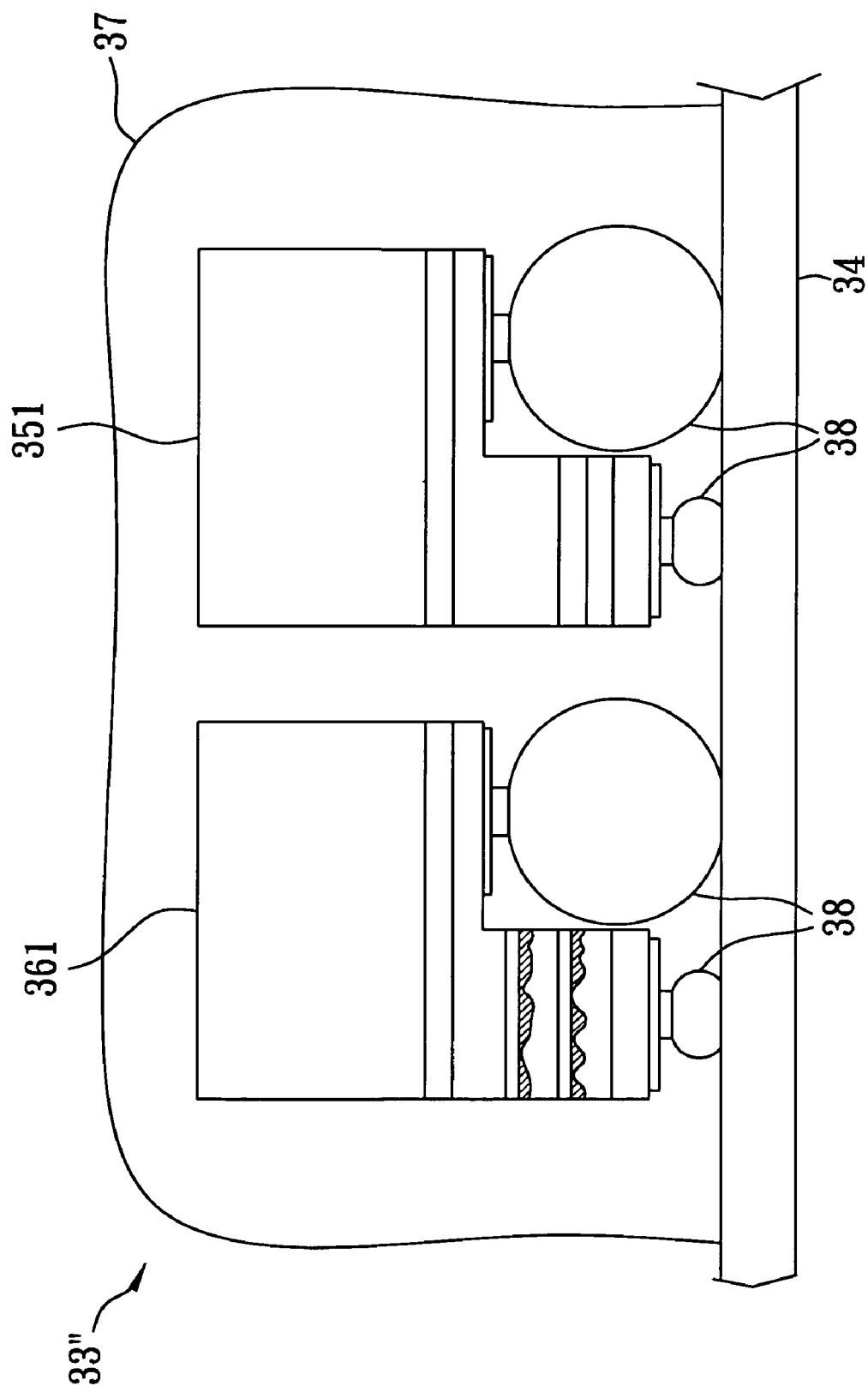
FIG. 13 is a fragmentary schematic view of the fourth preferred embodiment of a white-light emitting device according to this invention.

Referring to FIG. 13, the fourth preferred embodiment of a white-light emitting device 33" according to this invention is shown to include the first die 351 and the second die 361 mounted on the conductive supporting unit 34 in a flip-chip manner through a plurality of electrically conductive spheres 38, and a light-transmissive encapsulating material 37 encapsulating the first and second dies 351,361. The light-transmissive encapsulating material 37 used in this preferred embodiment is resin.

Figure 14:
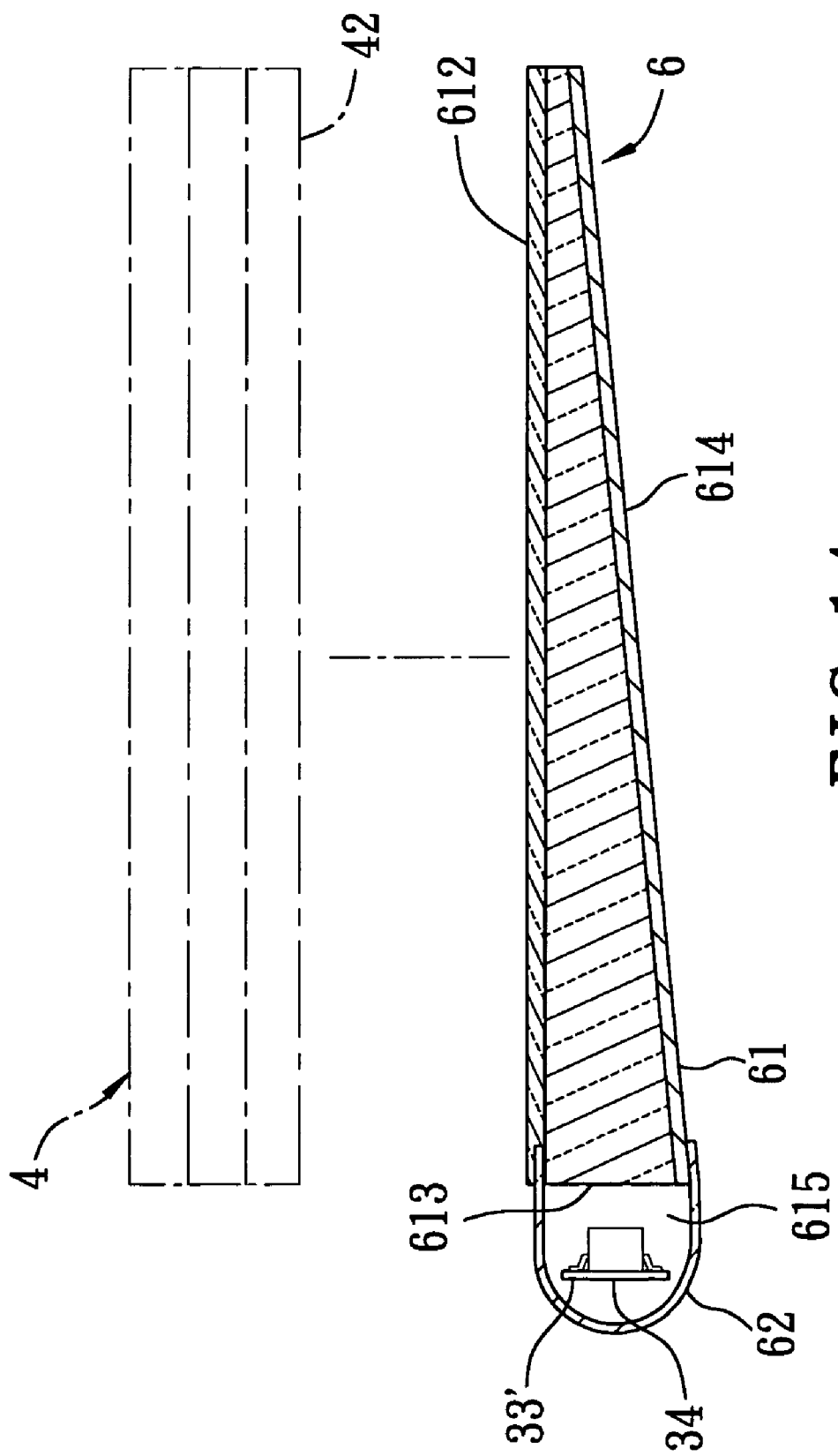
FIG. 14 is a schematic sectional view of a side-edge type backlight module incorporating the white-light emitting device of this invention.
Figure 15:
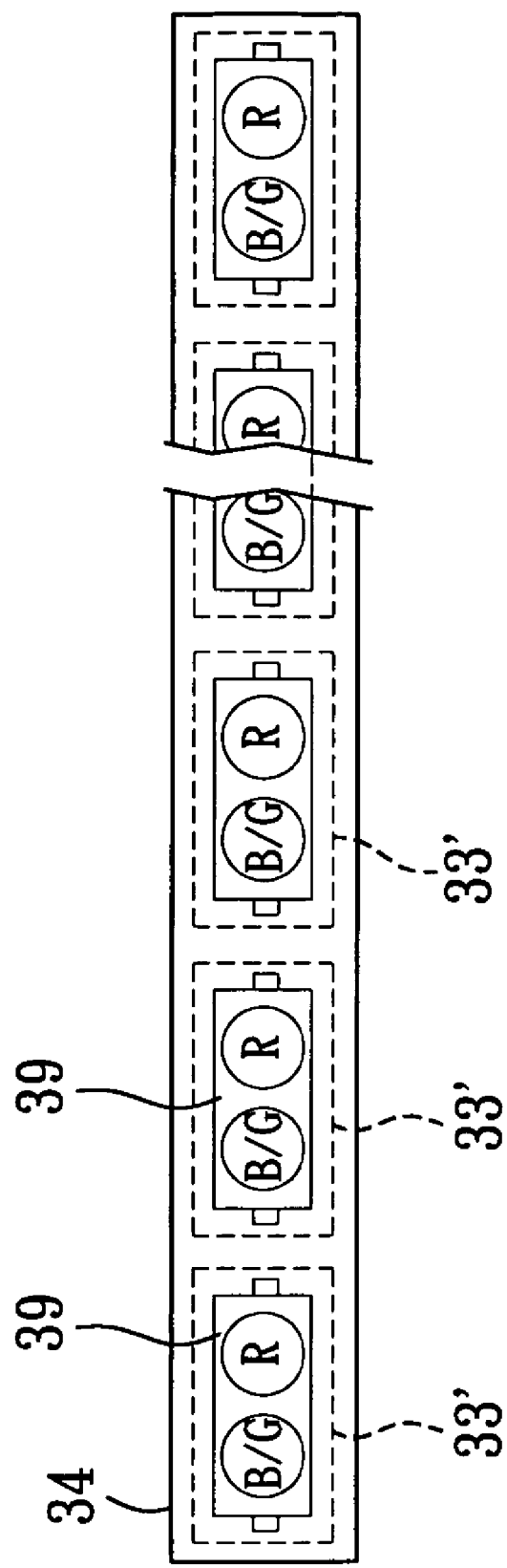
FIG. 15 is a fragmentary schematic side view of the backlight module of FIG. 14.

Referring to FIGS. 14 and 15, a side-edge type backlight module 6 is shown, which incorporates the first preferred embodiment of the white-light emitting device 33' of this invention. The backlight module 6 is disposed on the rear side 42 of the liquid crystal module 4, and includes a light guide panel 61, a reflective member 62 defining a receiving space 615, and a plurality of the white-light emitting devices 33'. The light guide panel 61 has a top face 612 connected to the rear side 42 of the liquid crystal module 4, a bottom face 614 opposite to the top face 614 and inclined relative to the top face 612, and a side face 613 extending between the top and bottom faces 612,614. The reflective member 62 is mounted proximate to the side face 613 of the light guide panel 61. The white-light emitting devices 33' are mounted on the conductive supporting unit 34, which is a printed circuit board in the preferred embodiment.

The white light emitted from the white-light emitting devices 33 is either transmitted directly into the light guide panel 61 through the side face 613 of the light guide panel 61, or is reflected by the reflective member 62 and is then transmitted into the light guide panel 61 through the side face 613 of the light guide panel 61. The white light transmitted into the light guide panel 61 is reflected by the bottom face 614 of the light guide panel 61, and is transmitted to the liquid crystal module 4 through the top face 612 of the light guide panel 61 and the rear side 42 of the liquid crystal module 4.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A white-light emitting device, comprising:
   a first die including a first semiconductor light-emitting layer emitting a first primary color light; and
   a second die including a second semiconductor light-emitting layer emitting a second primary color light, and a third semiconductor light-emitting layer mounted proximate to said second semiconductor light-emitting layer and emitting a third primary color light;
   said first primary color light being combined with said second and third primary color lights so as to produce white light,
   wherein said second die further includes a p-type cladding layer and an n-type cladding layer, said second and third semiconductor light-emitting layers being disposed between said p-type and n-type cladding layers, and
   wherein said second semiconductor light-emitting layer includes a first barrier film proximate to said p-type cladding layer, a second barrier film proximate to said third semiconductor light-emitting layer, and a carrier confining film between said first and second barrier films and having a plurality of alternating peaks and valleys, said carrier confining film having an energy gap smaller than those of said first and second barrier films.

2. The device as claimed in claim 1, wherein said first primary color light is red light having a wavelength ranging from 575 nm to 700 nm, said second primary color light being blue light having a wavelength ranging from 430 nm to 485 nm, said third primary color light being green light having a wavelength ranging from 510 nm to 560 nm.

3. The device as claimed in claim 1, wherein said carrier confining film is made of a material having formula $Al_{(1-x-y)}In_yGa_xN$, wherein $0 \leq x < 1$, $0 < y \leq 1$, and $0 \leq 1-x-y < 1$.

4. The device as claimed in claim 1, wherein second semiconductor light-emitting layer has a valley density ranging from 5% to 75%, said valley density being defined by a ratio of a summation of the widths of said valleys to a total length of said second semiconductor light-emitting layer along a direction that said widths are measured.

5. The device as claimed in claim 1, further comprising a carrying pad carrying said first and second dies thereon, a first lead frame electrically connected to said first and second dies, and a second lead frame electrically connected to said first and second dies.

6. The device as claimed in claim 5, wherein said carrying pad includes a receiving recess for receiving said first and second dies, and a light-transmissive encapsulating material filled in said receiving recess to encapsulate said first and second dies.

* * * * *